United States Patent [19]
Akioka et al.

[11] Patent Number: 5,929,653
[45] Date of Patent: Jul. 27, 1999

[54] SEMICONDUCTOR INTEGRATED CIRCUIT HAVING PROGRAMMABLE ENABLING CIRCUIT

[75] Inventors: Toshiaki Akioka, Kanagawa; Yukio Fuji, Kawasaki, both of Japan

[73] Assignee: NEC Corporation, Tokyo, Japan

[21] Appl. No.: 08/903,159

[22] Filed: Jul. 30, 1997

[30] Foreign Application Priority Data

Jul. 30, 1996 [JP] Japan ................................. 8-200659

[51] Int. Cl.⁶ ............................................. H03K 19/173
[52] U.S. Cl. ............................................. 326/37; 326/49
[58] Field of Search ................................. 326/37, 49, 38, 326/82, 83; 327/407, 408

[56] References Cited

U.S. PATENT DOCUMENTS

| | | | |
|---|---|---|---|
| 4,292,548 | 9/1981 | Suarez et al. | 326/37 |
| 4,612,459 | 9/1986 | Pollachek . | |
| 4,931,946 | 6/1990 | Ravindra et al. | 364/490 |
| 5,179,540 | 1/1993 | Stockton . | |
| 5,502,401 | 3/1996 | Simpson et al. | 326/38 |
| 5,598,114 | 1/1997 | Jamshidi | 326/113 |
| 5,726,585 | 3/1998 | Kim | 326/38 |
| 5,856,746 | 1/1999 | Petrick | 326/17 |

FOREIGN PATENT DOCUMENTS

| | | |
|---|---|---|
| 51-139285 | 12/1976 | Japan . |
| 57-66589 | 4/1982 | Japan . |
| 2-109419 | 4/1990 | Japan . |
| 7-7225 | 1/1995 | Japan . |

*Primary Examiner*—Michael Tokar
*Assistant Examiner*—Richard Roseen
*Attorney, Agent, or Firm*—Scully, Scott, Murphy & Presser

[57] ABSTRACT

A semiconductor integrated circuit is provided, which decrease the circuit scale of an enabling circuit used for enabling and disabling an internal circuit. The enabling circuit has a first switching element with first and second terminals, a second switching element with first and second terminals, and a third switching element with first and second terminals. One of the first, second, and third switching elements is turned on and the remaining two ones thereof are turned off according to a program. The first terminal of the first switching element is applied with an enabling signal. The first terminal of the second switching element is applied with a disabling signal. The first terminal of the third switching element is applied with a Don't Care signal. The second terminals of the first, second, and third switching elements are connected in common to a node. One of the enabling signal, the disabling signal, and the Don't Care signal is selectively outputted to the node according to the program.

4 Claims, 5 Drawing Sheets

SEMICONDUCTOR INTEGRATED CIRCUIT HAVING PROGRAMMABLE ENABLING CIRCUIT

BACKGROUND OF THE INVENTION

1. Field of the Invention

The present invention relates to a semiconductor integrated circuit and more particularly, to a semiconductor integrated circuit having an internal circuit and a programmable enabling circuit, in which the internal circuit is enabled or activated by an enabling signal outputted from the programmed enabling circuit.

2. Description of the Prior Art

Conventionally, semiconductor integrated circuits of this sort have been widely used for various semiconductor devices or chips that are enabled or activated by an enabling or chip-selection signal to perform their functions.

For example, with a semiconductor memory device necessitating essentially a large memory space, a lot of semiconductor integrated circuits of this sort are incorporated into the memory device. If all of the integrated circuits thus incorporated in the memory device are always active, the semiconductor memory device will consume a lot of electric power. Then, to decrease the electric power consumption of the memory device, a required one or ones of the incorporated integrated circuits is/are selectively enabled to operate with the use of their enabling or chip-selection signals.

Accordingly, various types of the semiconductor integrated circuits of this sort have been known, in which the enabling (or, chip-selection) circuit is designed to output an enabling signal with a specific "active level" to the internal circuit.

The "active level" is typically defined in such a way that the enabling signal from the enabling circuit may take any one of three logical states, "Low (L)", "High (H)", and "Don't Care" logic states.

If the active level of the enabling signal is set as the low logic state, the internal circuit will be active only when an input signal with the low logic state is applied to the enabling circuit.

If the active level of the enabling signal is set as the high logic state, the internal circuit will be active only when an input signal with the high logic state is applied to the enabling circuit.

If the active level of the enabling signal is set as the Don't Care logic state, the internal circuit will be always active independent of the values or levels of the input signal for the enabling circuit.

The enabling or chip-select circuit is usually programmable according to the customer's or user's requirement.

Examples of the programmable enabling circuit of this sort were disclosed in the U.S. Pat. Nos. 4,612,459 issued in September 1986 and 5,179,540 issued in January 1993.

FIG. 1 shows the example of the enabling circuit for enabling or disabling the operation of an inner circuit, which was disclosed in the U.S. Pat. No. 4,612,459.

As shown in FIG. 1, the conventional programmable enabling circuit includes a NOR circuit 34, an Exclusive OR (EOR) circuit 35, a first programming circuit 36, and a second programming circuit 37.

The first programming circuit 36 is composed of two n-channel Metal-Oxide-Semiconductor Field-Effect Transistors (MOSFETs) N36 and N37. A drain of the MOSFET N36 is applied with a power supply voltage of $V_{DD}$. A gate and a source of the MOSFET N36 are coupled together to be connected to a drain of the MOSFET N37. A gate and a source of the MOSFET N37 are coupled together to be connected to the ground. Thus, the two MOSFETs N36 and N37 are serially connected to each other between the voltage level of $V_{DD}$ and the ground.

The connection point of the gate and source of the MOSFET N36 and the drain of the MOSFET N37 forms a node A', which is connected to an input Y of the NOR circuit 34.

A two-valued input signal IN is applied to another input X of the NOR circuit 34.

The second programing circuit 37 is composed of two n-channel MOSFETs N38 and N39. A drain of the MOSFET N38 is applied with the power supply voltage of $V_{DD}$. A gate and a source of the MOSFET N38 are coupled together to be connected to a drain of the MOSFET N39. A gate and a source of the MOSFET N39 are coupled together to be connected to the ground. Thus, the two MOSFETs N38 and N39 are serially connected to each other between the voltage level of $V_{DD}$ and the ground.

The connection point of the gate and source of the MOSFET N38 and the drain of the MOSFET N39 forms a node B', which is connected to an input Y of the EOR circuit 35.

An output F of the NOR circuit 34 is connected to another input X of the EOR circuit 35. The connection point of the output F of the NOR circuit 34 and the input X of the EOR circuit 35 forms a node C'.

A two-valued output signal OUT of the conventional enabling circuit in FIG. 1, which serves as an enabling signal, is derived from an output F of the EOR circuit 35. This output signal OUT is applied to an input terminal of the inner circuit (not shown) to be enabled.

When an ion-implantation method is used for programming the active level of the input signal IN, the MOSFETs N36, N37, N38, and N39 in the first and second programming circuits 36 and 37 are each fabricated as an enhancement-type (normally-off) one and then, a selected one or ones of them is/are converted to a depletion-type (normally-on) one or ones according to a specific program by an ion-implantation method of a dopant with five valence electrons such as phosphorus (P). The ion-implantation method has been popularly used for fabricating mask Read-Only Memories (ROMs).

The first programming circuit 36 determines the availability for the input signal IN.

If the N-channel MOSFET N36 is converted to a depletion-type one by an ion-implantation method, the voltage or electric potential at the node A' will be at a high (H) level. As a result, the output signal level of the NOR circuit 34, i.e., the voltage level at the node C', will be fixed at a low (L) level.

On the other hand, if the N-channel MOSFET N37 is converted to a depletion-type one by an ion-implantation method, the voltage at the node A' will be at a low level. As a result, when the input signal IN is at a low voltage level, the output signal of the NOR circuit 34 at the node C' will be at a high level. When the input signal IN is at a high voltage level, the output signal level of the NOR circuit 34 at the node C' will be low.

This means that the inner circuit to be enabled by the circuit in FIG. 1 is enabled or disabled according to the level of the input signal IN.

The second programming circuit 37 determines the active level for the internal circuit.

If the N-channel MOSFET N38 is converted to a depletion-type one by an ion-implantation method, the voltage at the node B' will be at a high level. As a result, the voltage of the output signal OUT from the EOR circuit 35 will be at a high or low level when the voltage at the node C' is at a low or high level, respectively.

On the other hand, if the N-channel MOSFET N39 is converted to a depletion-type one by an ion-implantation method, the voltage level at the node B' will be low. As a result, the voltage of the output signal OUT from the EOR circuit 35 will be at a low or high level when the voltage level at the node C' is low or high, respectively.

This means that the active level for the inner circuit is optionally set as high or low according to the programming circuit 37.

Next, the behavior of the conventional enabling circuit in FIG. 1 is explained below with reference to the following TABLE 1, where the characters "D" and "E" denote the "Depletion" type and the "Enhancement" type, respectively.

node C') will be at a high level. Therefore, the output signal OUT from the EOR circuit 35 will be at a high level, disabling the inner circuit (i.e., the inner circuit becomes inactive).

If the input signal IN is at a high level, the output signal of the NOR circuit 34 (i.e., the voltage at the node C') will be at a low level. Therefore, the output signal OUT from the EOR circuit 35 will be at a low level, enabling the inner circuit (i.e., the inner circuit becomes active).

To set the active level of the input signal IN in a Don't Care condition (Case 3 in TABLE 1), the MOSFET N36 in the first programming circuit 36 and the MOSFET N39 in the second programming circuit 37 are converted to depletion-type ones, respectively. In this case, the voltage at the node A' is at a high level and the voltage at the node B' is at a low level.

Therefore, the output signal of the NOR circuit 34 (i.e., the voltage at the node C') will be fixed at a low level, which is independent of the level of the input signal IN. Therefore, the output signal OUT from the EOR circuit 35 will be always at a low level, enabling always the inner circuit active (i.e., the inner circuit is kept active).

TABLE 1

| | TRANSISTOR TYPE | | | | SIGNAL LEVEL | | | | | ACTIVE |
|---|---|---|---|---|---|---|---|---|---|---|
| CASE | N36 | N37 | N38 | N39 | IN | NODE A' | NODE B' | NODE C' | OUT | LEVEL |
| 1 | E | D | D | E | L | L | H | H | L | L |
| | | | | | H | L | H | L | H | |
| 2 | E | D | E | D | L | L | L | H | H | H |
| | | | | | H | L | L | L | L | |
| 3 | D | E | E | D | L | H | L | L | L | DON'T |
| | | | | | H | H | L | L | L | CARE |

Here, it is supposed that the internal circuit is activated when the output signal OUT of the enabling circuit in FIG. 1 is at a low level.

To set the active level of the input signal IN at a low level (Case 1 in TABLE 1), the MOSFET N37 in the first programming circuit 36 and the MOSFET N38 in the second programming circuit 37 are converted to depletion-type ones, respectively. In this case, the voltage or potential at the node A' is at a low level and the voltage at the node B' is at a high level.

Therefore, if the input signal IN is at a low level, the output signal of the NOR circuit 34 (i.e., the voltage at the node C') will be at a high level. Therefore, the output signal OUT from the EOR circuit 35 will be at a low level, enabling the inner circuit (i.e., the inner circuit becomes active).

If the input signal IN is at a high level, the output signal of the NOR circuit 34 (i.e., the voltage at the node C') will be at a low level. Therefore, the output signal OUT from the EOR circuit 35 will be at a high level, disabling the inner circuit (i.e., the inner circuit becomes inactive).

To set the active level of the input signal IN at a high level (Case 2 in TABLE 1), the MOSFET N37 in the first programming circuit 36 and the MOSFET N39 in the second programming circuit 37 are converted to depletion-type ones, respectively. In this case, the voltage at the node A' is at a low level and the voltage at the node B' also is at a low level.

Therefore, if the input signal IN is at a low level, the output signal of the NOR circuit 34 (i.e., the voltage at the If the input signal IN is at a high level, the output signal of the NOR circuit 34 (i.e., the voltage at the node C') will be at a low level. Therefore, the output signal OUT from the EOR circuit 35 will be at a low level, enabling the inner circuit active (i.e., the inner circuit becomes active).

As explained above, the active level of the input signal IN to the enabling circuit in FIG. 1 is able to be optionally programmed by (a) obtaining a logical sum of the output signal of the first programming circuit 36 and the input signal IN, and then, (b) obtaining an exclusive logical sum of the logical sum thus obtained in the step (a) and the output signal of the second programming circuit 37.

With the conventional enabling circuit in FIG. 1, there are provided with the NOR circuit 34, the EOR circuit 35, and the first and second programming circuits 36 and 37. The NOR circuit 34 needs at least 4 transistors to realize a NOR function and the EOR circuit 35 needs at least 6 transistors to realize a EOR function. Accordingly, the circuit in FIG. 1 needs at least 14 transistors in total for realizing an enabling function.

Additionally, a conventional enabling circuit shown in FIG. 2 in the U.S. Pat. No. 4,612,459 includes 16 transistors, not 14. This is because this circuit includes an Exclusive NOR (ENOR) circuit necessitating at least 8 transistors, instead of an EOR circuit.

To further enhance the integration-scale and device miniaturization in the semiconductor integrated circuit, it has been required to decrease the scale of individual incorporated circuits. From this point of view, the number of necessary transistors needs to be reduced in the enabling circuit of this sort, decreasing the circuit scale.

Further, with the conventional enabling circuit in FIG. 1, the drains of the n-channel MOSFETs N36 and N38 in the first and second programming circuits 36 and 37 are directly connected to the power supply voltage $V_{DD}$. Generally, an n-channel MOSFET is lower in withstand voltage than a p-channel MOSFET. As a result, there is a problem that the MOSFETs N36 and N38 tend to be destroyed or damaged due to electrostatic discharge or the like.

To solve this problem, two p-channel MOSFETs may be additionally provided between the MOSFETs N36 and N38 and the power supply voltage level of $V_{DD}$, respectively.

SUMMARY OF THE INVENTION

Accordingly, an object of the present invention is to provide a semiconductor integrated circuit that decreases the circuit scale of a programmable enabling circuit used for enabling and disabling an inner circuit.

Another object of the present invention is to provide a semiconductor integrated circuit having enhanced reliability.

The above objects together with others not specifically mentioned will become clear to those skilled in the art from the following description.

A semiconductor integrated circuit according to the present invention includes an internal circuit and a programmable enabling circuit for enabling the internal circuit.

The enabling circuit has a first switching element with first and second terminals, a second switching element with first and second terminals, and a third switching element with first and second terminals. One of the first, second, and third switching elements is turned on and the remaining two ones thereof are turned off according to a program.

The first terminal of the first switching element is applied with an enabling signal. The first terminal of the second switching element is applied with a disabling signal. The first terminal of the third switching element is applied with a Don't Care signal.

The second terminals of the first, second, and third switching elements are connected in common to a node.

One of the enabling signal, the disabling signal, and the Don't Care signal is selectively outputted to the node according to the program.

With the semiconductor integrated circuit according to the present invention, when only the first switching element is turned on according to the program, the enabling signal is outputted to the node. When only the second switching element is turned on according to the program, the disabling signal is outputted to the node. When only the third switching element is turned on according to the program, the Don't Care signal is outputted to the node.

Therefore, the internal circuit becomes active or inactive, or in a Don't Care state according to one of the enabling, disabling, and Don't Care signals outputted to the node. This means that the inner circuit can be selectively activated according to the program.

Further, if each of the first, second, and third switching elements is composed of a fuse element, no transistors are required for these switching elements.

If a transistor or transistors is/are used, each of the first, second, and third switching elements may be composed of at least one MOS or bipolar transistor.

Therefore, the number of necessary transistors for the enabling circuit is decreased, which reduces the circuit scale of the enabling circuit.

Also, the first terminals of the first, second, and third switching elements are applied with the enabling signal, the disabling signal, and Don't Care signal, respectively. The enabling signal may be generated by directly applying a two-valued input signal to one of the first terminals of the first and second switching elements. The disabling signal may be generated by applying the inverted input signal to another one of the first terminals of the first and second switching elements. The Don't Care signal may be generated by simply applying a fixed electric potential to the first terminal of the third switching element.

Accordingly, it is unnecessary that each of the first, second, and third switching elements is directly connected to the level of a power supply voltage. As a result, even if an n-channel MOSFET that is relatively low in withstand voltage than a p-channel MOSFET is used, the above problem about the destruction or damage of the n-channel MOSFET due to electrostatic discharge will not arise. Thus, the reliability is enhanced.

In a preferred embodiment of the semiconductor integrated circuit according to the present invention, the first switching element includes a first MOSFET a gate and a source of which are coupled together and a second MOSFET a gate and a drain of which are coupled together. The gates of the first and second MOSFETs are coupled together.

In another preferred embodiment of the semiconductor integrated circuit according to the present invention, the third switching element includes a fifth MOSFET a gate and a source or drain of which are coupled together.

In still another preferred embodiment of the semiconductor integrated circuit according to the present invention, the turning-on state of each of the first, second, and third switching elements is realized by using at least one depletion-type MOSFET.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
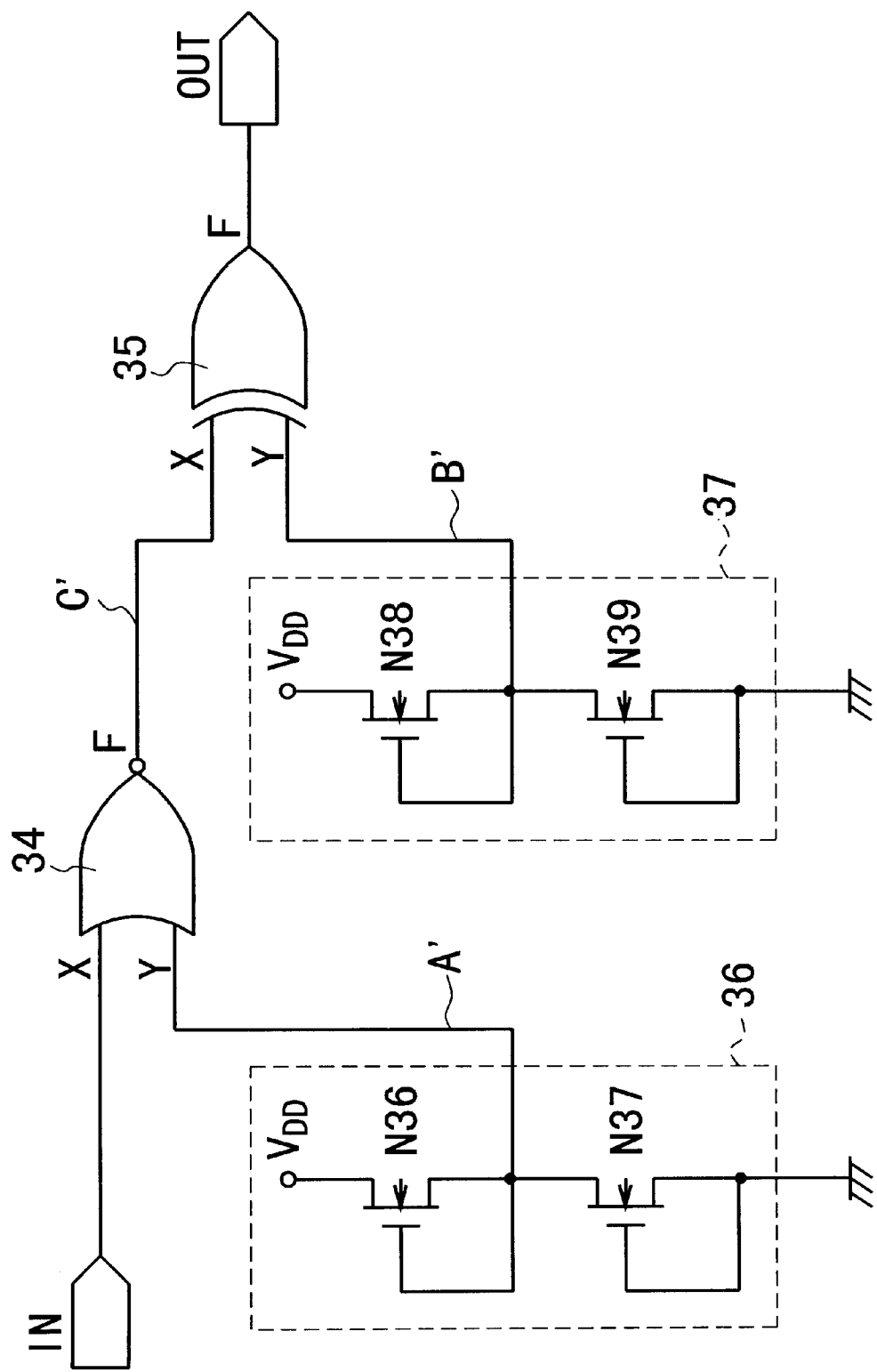
FIG. 1 is a circuit diagram showing a conventional enabling circuit.

Preferred embodiments of the present invention will be described below referring to the drawings attached.

BASIC CONFIGURATION

Figure 2:
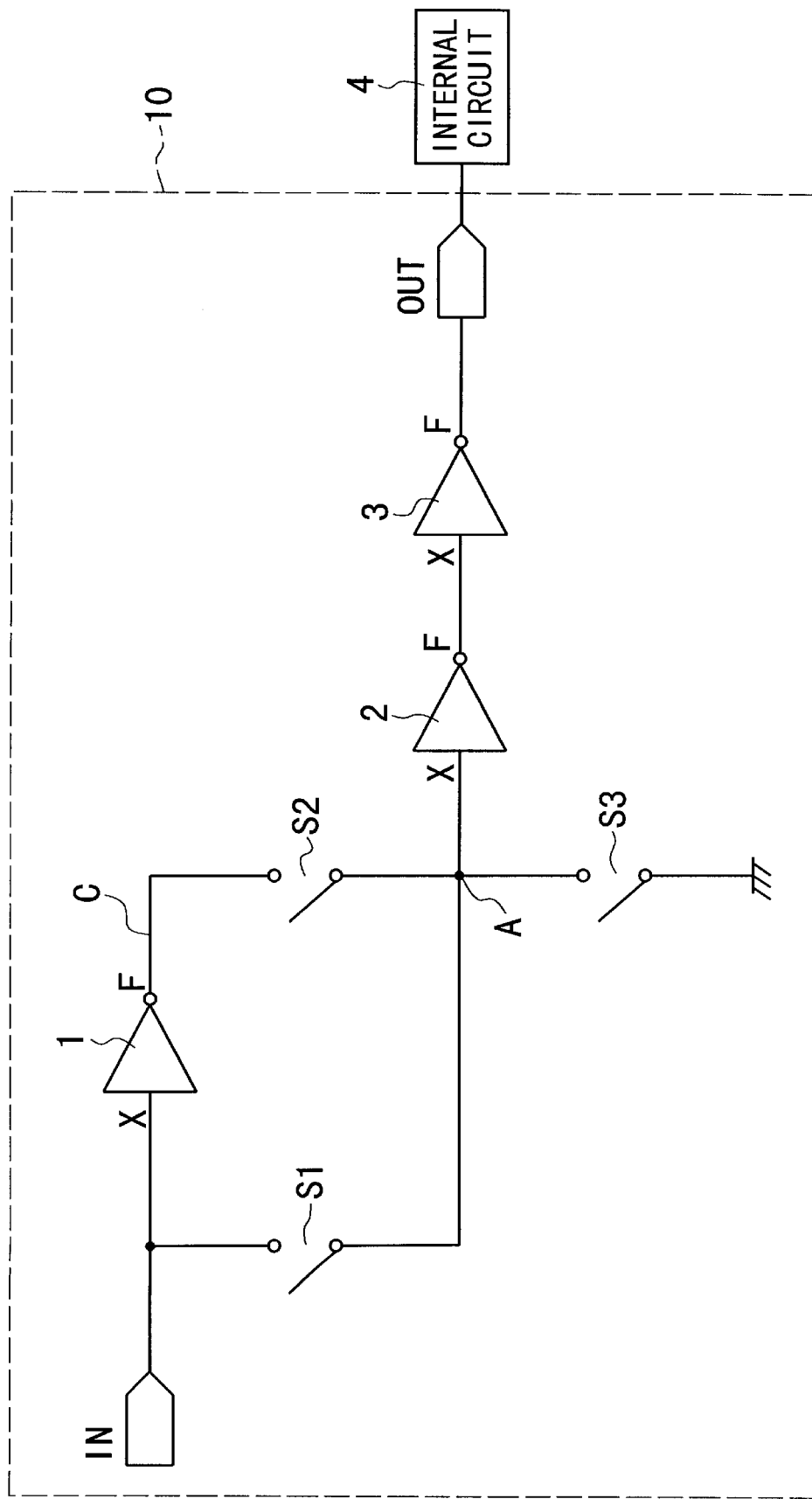
FIG. 2 is a circuit diagram showing the basic configuration of a semiconductor integrated circuit according to the present invention.

A semiconductor integrated circuit according to the present invention has the basic configuration as shown in FIG. 2.

As shown in FIG. 2, the semiconductor integrated circuit according to the present invention includes a programmable enabling circuit 10 and an internal circuit 4. The enabling circuit 10 has a function of enabling and disabling the internal circuit 4.

The enabling circuit 10 has a first inverter 1, a first switching element S1 with two terminals, a second switching element S2 with two terminals, and a third switching element S3 with two terminals, a second inverter 2, and a third inverter 3.

One of the first, second, and third switching elements S1, S2, and S3 is selectively turned on or closed, and the remaining two ones thereof are turned off according to a program. FIG. 2 shows the state of the enabling circuit 10 before programming.

An input x of the first inverter 1 is applied with a two-valued input signal IN. An output F of the first inverter 1 is connected to a node C. An output signal of the inverter 1, which is the inverted input signal IN, is outputted to the node C.

One of the two terminals of the first switching element S1 is applied with the input signal IN. The other one of the two terminals of the element S1 is connected to a node A. Therefore, the input voltage IN is outputted to the node A if the element S1 is turned on or closed. No signal is outputted to the node A if the element S1 is kept off or open.

One of the two terminals of the second switching element S2 is connected to the node C to be applied with the inverted input signal IN. The other one of the two terminals of the element S2 is connected to the node A. Therefore, the inverted input voltage IN is outputted to the node A if the element S2 is turned on. No signal is outputted to the node A if the element 52 is kept off.

One of the two terminals of the third switching element S3 is connected to the node A. The other one of the two terminals of the element S3 is connected to the ground. Therefore, the ground-level electric potential is applied to the node A if the element S3 is turned on. No signal is outputted to the node A if the element S3 is kept off.

An input x of the second inverter 2 is connected to the common node A to be applied with the electric potential at the common node A. In other words, the input x of the second inverter 2 is applied with one of the input signal IN, the inverted input signal IN, and the ground-level potential according to the switching states of the first, second, and third switching elements S1, S2, and S3. An output signal of the inverter 2 is an inverted one of these three signals.

An input x of the third inverter 3 is applied with the output signal of the second inverter 2. The input x of the inverter 2 is applied with the electric signal or potential at the common node A. An output signal of the inverter 3 is an inverted one of the output signal of the second inverter 2, which is the same as the electric signal or potential at the common node A.

The output signal of the third inverter 3, which serves as an output signal OUT of the enabling circuit 10, is inputted into the internal circuit 4, thereby enabling or disabling the circuit 4.

The second and third inverters 2 and 3 each have an amplification function of the signal at the common node A, which ensures a sufficient driving voltage for the internal circuit 4 independent of the amplitude of the voltage at the node A. Therefore, the output signal OUT is equal to an amplified one of the signal at the common node A by a specific gain.

Each of the first, second, and third switching elements S1, S2, and S3 may be formed by any element having a switching function, such as a fuse element, a single diode or more, a single MOS or bipolar transistor, or the combination of two MOS or bipolar transistors or more.

Next, the behavior or operation of the enabling circuit 10 is explained below with reference to the following TABLE 2.

TABLE 2

| CASE | SWITCH STATUS | | | SIGNAL LEVEL | | | | ACTIVE LEVEL |
| --- | --- | --- | --- | --- | --- | --- | --- | --- |
| | S1 | S2 | S3 | IN | NODE A | NODE C | OUT | |
| 1 | ON | OFF | OFF | L | L | H | L | L |
| | | | | H | H | L | H | |
| 2 | OFF | ON | OFF | L | H | H | H | H |
| | | | | H | L | L | L | |
| 3 | OFF | OFF | ON | L | L | H | L | DON'T CARE |
| | | | | H | L | L | L | |

Here, it is supposed that the internal circuit 4 is activated when the output signal OUT of the enabling circuit 10 is at a low level.

First, in the case 1 where programming for the enabling circuit 10 is made in such a way that the first switch S1 is turned on and the second and third switches S2 and S3 are kept off, if the input signal IN is at a low level, the voltage at the common node A becomes at a low level through the first switch S1. The signal at the node A is inverted twice by the second and third inverters 2 and 3, resulting in the output signal OUT at a low level. Thus, the internal circuit 4 is enabled or activated.

If the input signal IN is at a high level, the voltage at the common node A becomes at a high level through the first switch S1. The signal at the node A is inverted twice by the second and third inverters 2 and 3, resulting in the output signal OUT at a high level. Thus, the internal circuit 4 is disabled or inactivated.

As described above, in the case 1 in TABLE 2, the active level of the input signal IN can be programmed at a low level.

Second, in the case 2 where programming for the enabling circuit 10 is made in such a way that the second switch S2 is turned on and the first and third switches S1 and S3 are kept off, if the input signal IN is at a low level, the voltage at the common node A becomes at a high level through the second switch S2. The signal at the node A is inverted twice by the second and third inverters 2 and 3, resulting in the output signal OUT at a high level. Thus, the internal circuit 4 is disabled or inactivated.

If the input signal IN is at a high level, the voltage at the common node A becomes at a low level through the second switch S2. The signal at the node A is inverted twice by the second and third inverters 2 and 3, resulting in the output signal OUT at a low level. Thus, the internal circuit 4 is enabled or activated.

As described above, in the case 2 in TABLE 2, the active level of the input signal IN can be programmed at a high level.

Finally, in the case 3 where programming for the enabling circuit 10 is made in such a way that the third switch S3 is turned on and the first and second switches S1 and S2 are kept off, the input signal IN cannot be transmitted to the node A. Therefore, the voltage at the common node A becomes at the ground level through the third switch S3, which is independent of the status of the input signal IN.

This means that the output signal OUT is fixed at a low level and as a result, the internal circuit 4 is always enabled or activated.

Thus, in the case 3 in TABLE 2, the active level of the input signal IN can be programmed in a Don't Care state.

Further, if each of the first, second, and third switching elements S1, S2, and S3 is simply composed of a fuse element, no transistors are required for these switching elements. Each of the first, second, and third inverters 1, 2, and 3 may be realized by two transistors. Therefore, in this case, the number of necessary transistors for the enabling circuit 10 is decreased to six.

If a transistor or transistors is/are used, each of the first, second, and third switching elements S1, S2, and S3 may be composed of one or two MOS or bipolar transistors. Consequently, the number of necessary transistors for the first, second, and third switching elements S1, S2, and S3 is five. Therefore, in this case, the number of necessary transistors for the enabling circuit 10 is decreased to, for example, 11.

Accordingly, the number of necessary transistors for the enabling circuit 10 is decreased compared with the conventional one shown in FIG. 1, which reduces the circuit scale of the enabling circuit 10.

Although it is supposed that the internal circuit 4 is activated when the output signal OUT is at a low level in the above explanation, it is needless to say that the internal circuit 4 may be activated by the output signal OUT at a high level. This case may be readily realized in FIG. 2 by eliminating the third inverter 3 which may be formed by two transistors. In this case, the number of necessary transistors for the enabling circuit 10 will be further decreased to four or nine.

Moreover, although one of the two terminals of the third switch element S3 is applied with the ground-level potential, it is clear that it may be applied with any other constant level of electric potential. For example, one of the two terminals of the third switch element S3 may be applied with a positive or negative power supply voltage, or it may be connected to any signal line at a fixed potential level.

FIRST EMBODIMENT

Figure 4:
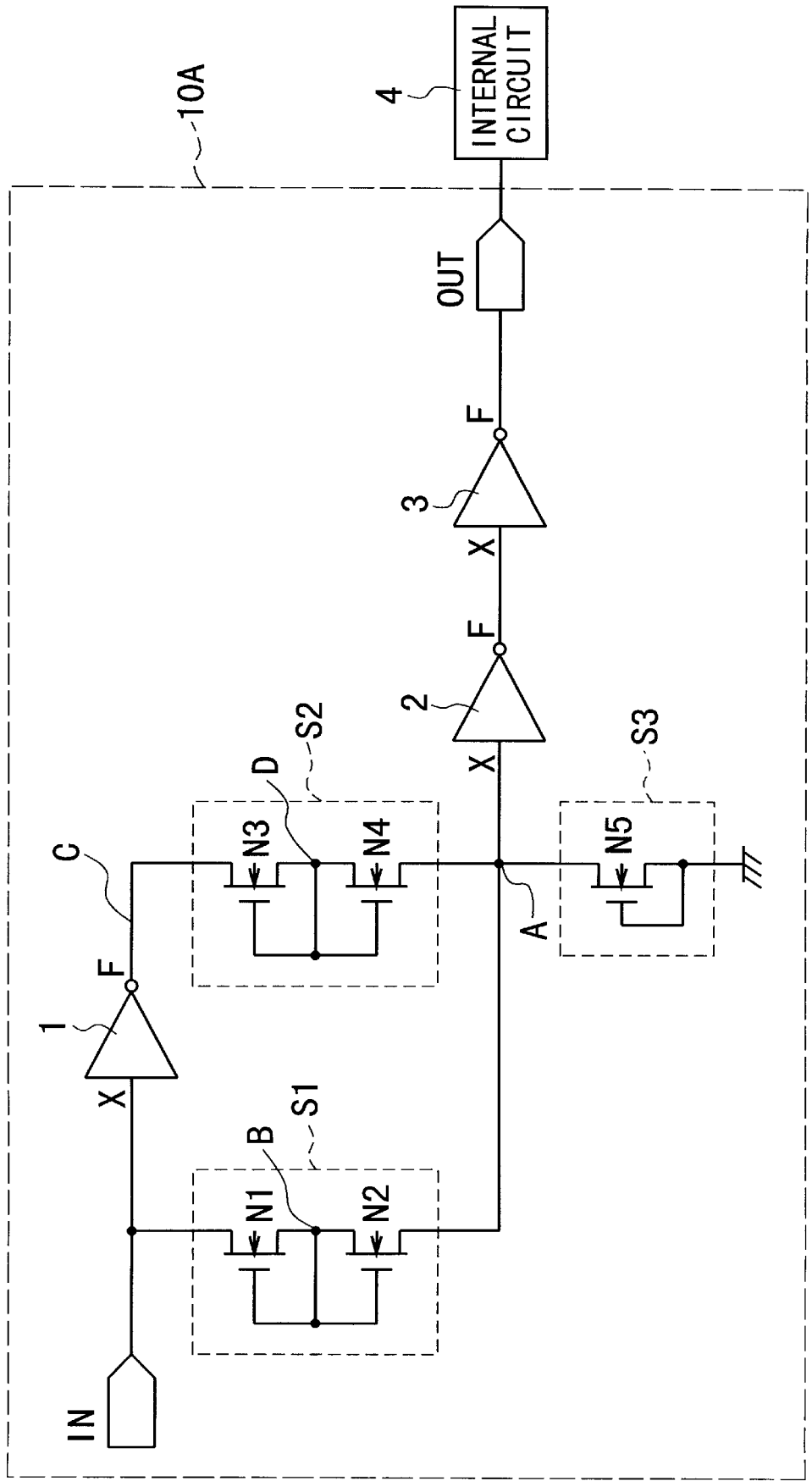
FIG. 4 is a circuit diagram showing a semiconductor integrated circuit according to a first embodiment of the present invention.

FIG. 4 shows a semiconductor integrated circuit according to a first embodiment of the present invention, in which the first, second, and third switching elements S1, S2, and S3 are formed by one or two MOSFETs, respectively, and the remaining structure is the same as that in FIG. 2.

Therefore, the description about the same structure is omitted here by adding the same reference numerals or characters to the corresponding elements or circuits in FIG. 4 for the sake of simplification of description.

FIG. 4 shows the state of the enabling circuit 10A before programming.

The first switching element S1 is composed of two n-channel MOSFETs N1 and N2. A gate and a source of the MOSFET N1 are coupled together to be connected to a node B. A drain of the MOSFET N1 is applied to be the input signal IN. A gate and a drain of the MOSFET N2 are coupled together to be connected to the node B. A source of the MOSFET N2 is connected to the node A. Since the source of the MOSFET N1 is connected to the drain of the MOSFET N2, it is said that these two MOSFETs N1 and N2 are serially connected to each other.

The second switching element S2 is composed of two n-channel MOSFETs N3 and N4. A gate and a source of the MOSFET N3 are coupled together to be connected to a node D. A drain of the MOSFET N3 is connected to the node C to be applied with the inverted input signal IN. A gate and a drain of the MOSFET N4 are coupled together to be connected to the node D. A source of the MOSFET N4 is connected to the node A. Since the source of the MOSFET N3 is connected to the drain of the MOSFET N4, it is said that these two MOSFETs N3 and N4 are serially connected to each other.

The third switching element S3 is composed of an n-channel MOSFET N5. A gate and a source of the MOSFET N5 are coupled together to be connected to the ground. A drain of the MOSFET N5 is connected to the node A.

Next, the behavior or operation of the enabling circuit 10A is explained below with reference to the following TABLE 3.

TABLE 3

| CASE | TRANSISTOR TYPE | | | | | SIGNAL LEVEL | | | | AC-TIVE LEVEL |
| --- | --- | --- | --- | --- | --- | --- | --- | --- | --- | --- |
| | N1 | N2 | N3 | N4 | N5 | IN | NODE A' | NODE B' | OUT | |
| 1 | D | D | E | E | E | L | L | H | L | L |
| | | | | | | H | H | L | H | |
| 2 | E | E | D | D | E | L | H | H | H | H |
| | | | | | | H | L | L | L | |
| 3 | E | E | E | E | D | L | L | H | L | DON'T CARE |
| | | | | | | H | L | L | L | |

First, in the case 1 where programming for the enabling circuit 10A is made in such a way that the first switch S1 is turned on and the second and third switches S2 and S3 are kept off, the MOSFETs N1 and N2 in the switch S1 are converted to depletion-type ones by an ion-implantation method, respectively. Therefore, the first switch S1 is always on or closed independent of the gate voltage.

The ion-implantation method is well known as a very popular coding method in a mask ROM fabrication sequence, which makes it possible to optionally program the enabling circuit 10A.

The MOSFETs N3 and N4 in the second switch S2 and the MOSFET N5 in the third switch S3 are not ion-implanted and are kept as enhancement-type devices. Therefore, the second and third switches S2 and S3 are normally open or off, and are turned on if the applied gate voltages are equal to or higher than the specific values.

However, the combination of the second and third switches S2 and S3 is always closed, because of the following reason.

For example, when the potential at the node C (i.e., the drain voltage of the MOSFET N3) is at a high level and the potential at the node A (i.e., the source voltage of the MOSFET N4) is at a low level, the MOSFET N3 will be turned on if a specific potential condition is satisfied. This potential condition is that the potential at the node D is higher than a sum of the high-level potential at the node C and the threshold voltage of the MOSFET N3. However, no potential is applied to the node D and therefore, the above potential condition is never satisfied. This means that the n-channel MOSFET N3 is always off or open.

Similarly, the MOSFET N4 also will be turned on if a specific potential condition is satisfied. This potential condition is that the potential at the node D is higher than a sum of the low-level potential at the node A and the threshold voltage of the MOSFET N4. However, no potential is applied to the node D and therefore, the above potential condition is never satisfied. This means that the n-channel MOSFET N4 also is always off or open.

On the other hand, when the potential at the node C is at a low level and the potential at the node A is at a high level, the MOSFET N4 will be always off.

If the potential at the node D is at a low level, both of the MOSFETs N3 and N4 will be always off.

Because of the above-described reason, the second switch element S2 formed by the serially-connected, two n-channel MOSFETs N3 and N4 is always kept off or open. In other words, the node A is electrically insulated from the node C by the switch S2. As a result, there is an additional advantage that back flow and leakage in current are prevented from occurring through the switch element S2.

Furthermore, in the case 1, if the input signal IN is at a low level, the voltage at the common node C becomes at a high level through the first inverter 1. However, the second switching element S2 is turned off and therefore, the high-level signal at the node C is not transferred to the node A through the switching element S2. Instead, the input signal IN is transferred to the node A through the MOSFET N1, the node B, and the MOSFET N2, thereby outputting the low level signal to the node A. The low-level signal at the node A is then inverted twice by the second and third inverters 2 and 3, resulting in the output signal OUT at a low level. Thus, the internal circuit 4 is enabled or activated.

If the input signal IN is at a high level, the high-level signal is transferred to the node A through the first switching element S1, resulting in the output signal OUT at a high level. Thus, the internal circuit 4 is disabled or inactivated.

The n-channel MOSFET N5 in the third switching element S3 is always off independent of the level at the node A, because the gate and source of the MOSFET N5 are connected to the ground and the drain thereof is connected to the node A.

As described above, in the case 1 in TABLE 3, the active level of the input signal IN can be programmed at a low level.

Second, in the case 2 where programming for the enabling circuit 10A is made in such a way that the second switching element S2 is turned on and the first and third switching elements S1 and S3 are kept off, the MOSFETs N3 and N4 in the switching element S2 are converted to depletion-type ones by an ion-implantation method, respectively. Therefore, the second switching element S2 is always closed independent of the gate voltage.

The MOSFETs N1 and N2 in the first switch S1 and the MOSFET N5 in the third switch S3 are not ion-implanted and are kept as enhancement-type devices. Therefore, the first and third switches S1 and S3 are normally off and are turned on if the applied gate voltages are equal to or higher than the specific values. However, the combination of the transistors N1 and N2 is always off or open because of the same reason described previously for the transistors N3 and N4.

Furthermore, in the case 2, if the input signal IN is at a low level, the voltage at the common node C becomes at a high level through the first inverter 1. Since the second switching element S2 is always turned on, the high-level signal is transferred to the node A through the MOSFET N3, the node D, and the MOSFET N4. The high-level signal at the node A is then inverted twice by the second and third inverters 2 and 3, resulting in the output signal OUT at a high level. Thus, the internal circuit 4 is disabled or inactivated.

If the input signal IN is at a high level, the low-level signal is transferred to the node A through the second switching element S2, resulting in the output signal OUT at a low level. Thus, the internal circuit 4 is enabled or activated.

As described above, in the case 2 in TABLE 3, the active level of the input signal IN can be programmed at a high level.

Third, in the case 3 where programming for the enabling circuit 10A is made in such a way that the third switching element S3 is turned on and the first and second switching elements S1 and S2 are kept off, the MOSFET N5 in the switching element S3 is converted to a depletion-type one by an ion-implantation method. Therefore, the third switching element S3 is always closed or on independent of the gate voltage.

The MOSFETs N1 and N2 in the first switch S1 and the MOSFETs N3 and N4 in the second switch S2 are not ion-implanted and are kept as enhancement-type devices. Therefore, the first and second switches S1 and S2 are normally off and are turned on if the applied gate voltages are equal to or higher than the specific values. However, the combination of the transistors N1 and N2 is always open. Similarly, the combination of the transistors N3 and N4 also is always open.

Furthermore, in the case 3, the input signal IN is not transferred to the common node A and the ground-level potential is always applied to the node A. This means that the node A is kept at a low level. Accordingly, the output signal OUT is kept at a low level independent of the level of the input signal IN, thereby maintaining the internal circuit 4 enabled or activated. This means that the active level of the input signal IN can be programmed in a Don't Care state.

With the semiconductor integrated circuit according to the first embodiment, the first switching element S1 is composed of two MOSFETs, the second switching element S2 is composed of two MOSFETs, and the third switching element S1 is composed of an MOSFET. Each of the first, second, and third inverters 1, 2, and 3 is typically composed of two MOSFETs. As a result, the number of necessary MOSFETs for the enabling circuit 10 is 11, which is less than the conventional one in FIG. 1. This means that the circuit scale of the enabling circuit 10 is reduced.

When only the first switching element S1 is turned on according to the program, the enabling signal is outputted to the node A. When only the second switching element S2 is turned on according to the program, the disabling signal is outputted to the node A. When only the third switching element S3 is turned on according to the program, the Don't Care signal is outputted to the node A. Therefore, the internal circuit 4 becomes active or inactive, or in a Don't Care state according to one of the enabling, disabling, and Don't Care signals outputted to the node A. This means that the inner circuit 4 can be selectively activated according to the program.

Accordingly, it is unnecessary that each of the first, second, and third switching elements S1, S2, and S3 is directly connected to the level of a power supply voltage. As a result, even if an n-channel MOSFET that is relatively low in withstand voltage than a p-channel MOSFET is used, the above problem about the destruction or damage of the n-channel MOSFET due to electrostatic discharge will not arise. Thus, the reliability is enhanced.

Figure 3:
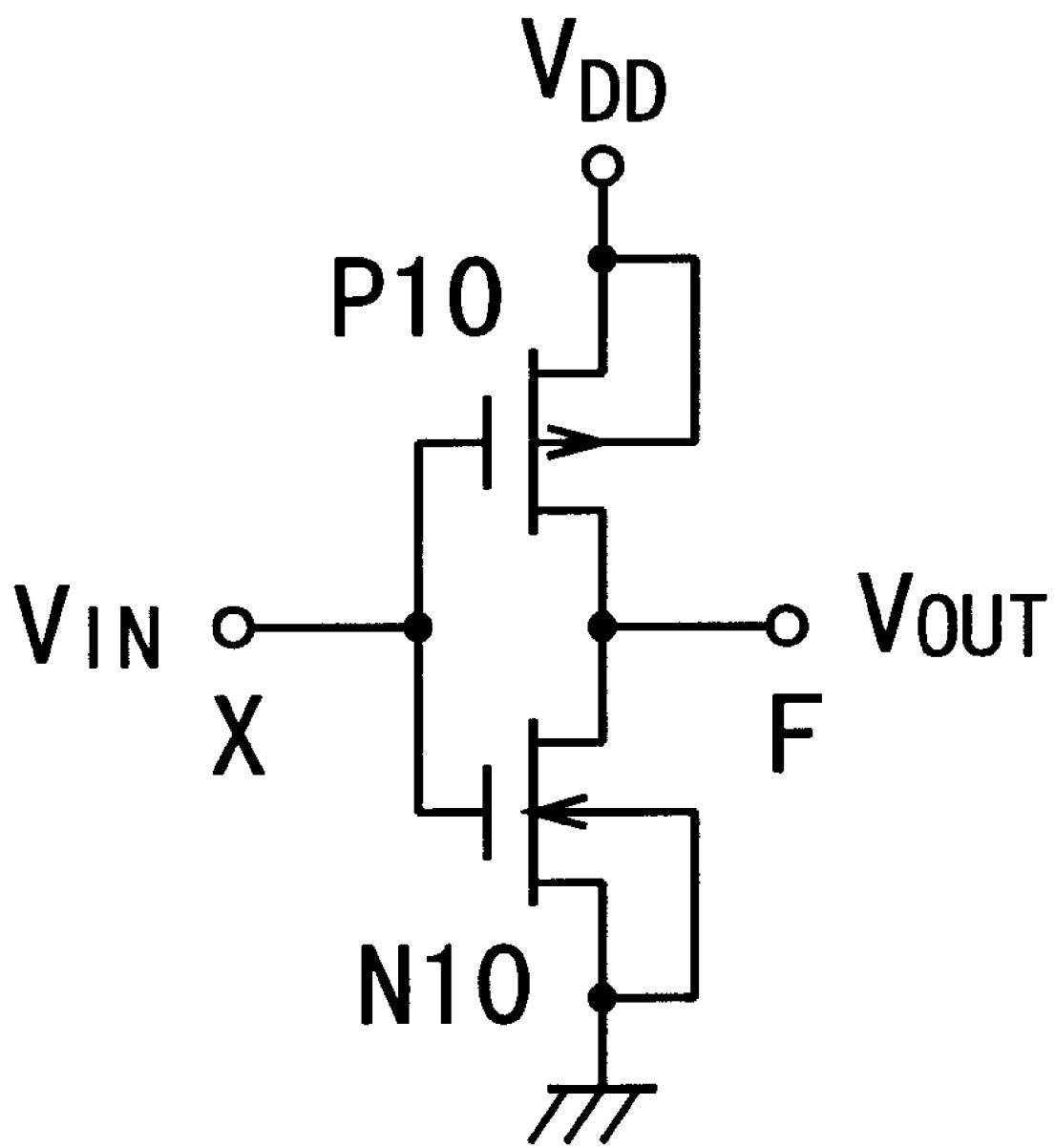
FIG. 3 is a circuit diagram of a CMOS inverter, which is used in the semiconductor integrated circuit according to the present invention.

FIG. 3 shows a typical example of the first, second, and third inverters 1, 2, and 3, which is a Complementary MOS (CMOS) inverter formed by a p-channel MOSFET P10 and an n-channel MOSFET N10.

A source of the MOSFET N10 is connected to the ground A drain of the MOSFET N10 is connected to a source of the MOSFET P10. A drain of the MOSFET P10 is applied with a power supply voltage $V_{DD}$. Gate of the MOSFETs P10 and N10 are coupled together to be applied with an input voltage $V_{IN}$. An output voltage $V_{OUT}$ is derived from the connection point of the drain of the MOSFET N10 and the source of the MOSFET P10.

SECOND EMBODIMENT

Figure 5:
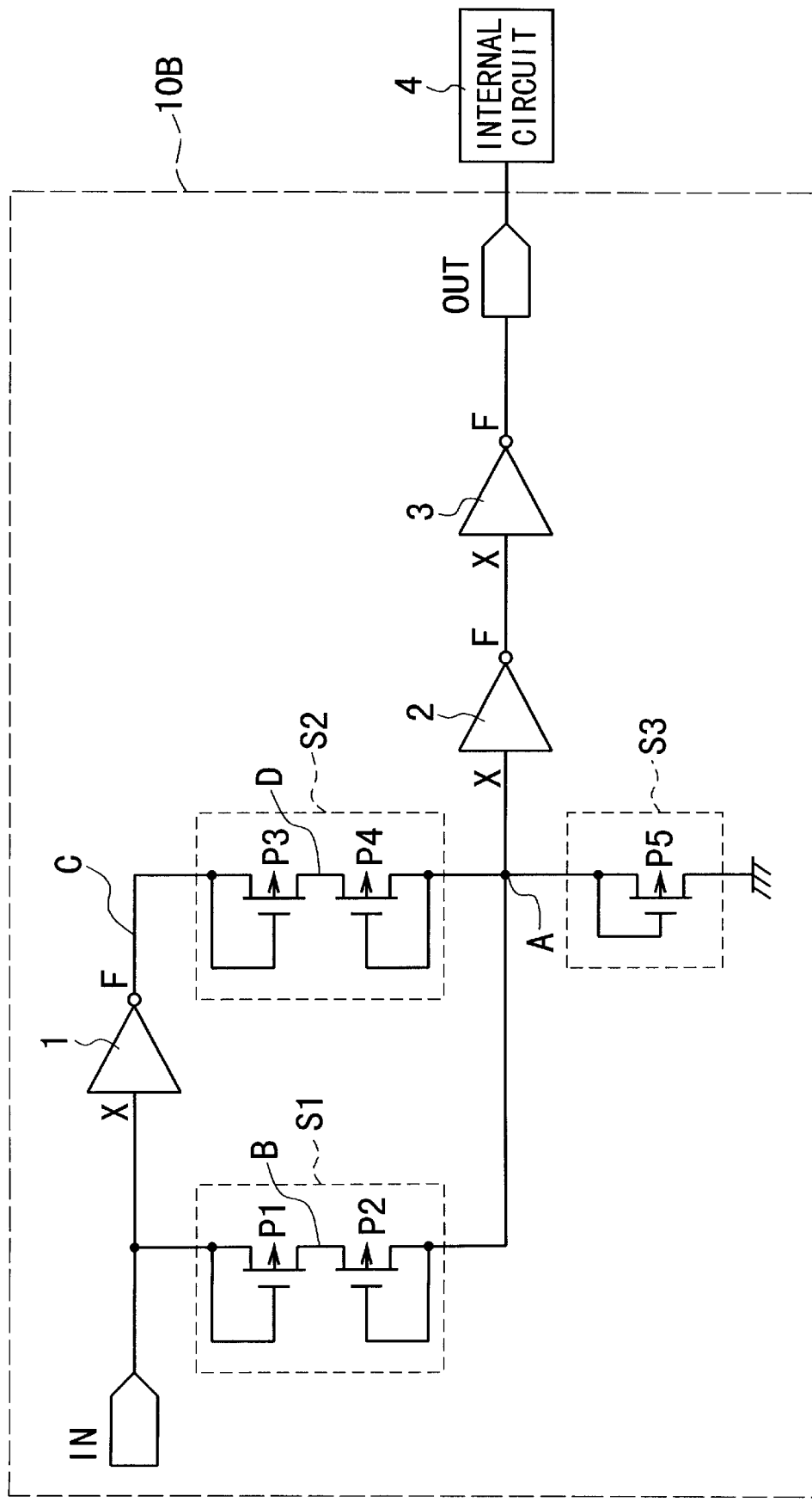
FIG. 5 is a circuit diagram showing a semiconductor integrated circuit according to a second embodiment of the present invention.

FIG. 5 shows a semiconductor integrated circuit according to a second embodiment of the present invention, which has the same configuration as that of the first embodiment in FIG. 4 except that each of the n-channel MOSFETs N1, N2, N3, N4, and N5 are replaced with p-channel MOSFETs P1, P2, P3, P4, and P5, respectively.

Since the operation of an enabling circuit 10B according to the second embodiment is substantially the same as that of the first embodiment in FIG. 2, the explanation about the operation is omitted here by simply providing TABLE 4 as shown below.

TABLE 4

| | TRANSISTOR TYPE | | | | | SIGNAL LEVEL | | | | ACTIVE LEVEL |
|---|---|---|---|---|---|---|---|---|---|---|
| CASE | P1 | P2 | P3 | P4 | P5 | IN | NODE A | NODE C | OUT | |
| 1 | D | D | E | E | E | L | L | H | L | L |
| | | | | | | H | H | L | H | |
| 2 | E | E | D | D | E | L | H | H | H | H |
| | | | | | | H | L | L | L | |
| 3 | E | E | E | E | D | L | L | H | L | DON'T |
| | | | | | | H | L | L | L | CARE |

In the above first and second embodiments, n- or p-channel MOSFETs are used for the switching elements S1, S2, and S3. However, the switching elements S1, S2, and S3 may be realized by electrical connection or disconnection in a patterned wiring or interconnection layer, or by cutting or breaking of at least one of previously-formed fuse elements.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor integrated circuit including an internal circuit and a programmable enabling circuit for enabling said internal circuit;

said enabling circuit comprising:
   a first switching element with first and second terminals;
   a second switching element with first and second terminals;
   a third switching element with first and second terminals;
   one of said first, second, and third switching elements being turned on and the remaining two ones thereof being turned off according to a program;
   said first terminal of said first switching element being applied with an enabling signal;
   said first terminal of said second switching element being applied with a disabling signal;
   said first terminal of said third switching element being applied with a Don't Care signal;
   said second terminals of said first, second, and third switching elements being connected in common to a node; and
   one of said enabling signal, said disabling signal, and said Don't Care signal being selectively outputted to said node according to said program.

2. A semiconductor integrated circuit as claimed in claim 1, wherein said first switching element includes a first MOSFET a gate and a source of which are coupled together and a second MOSFET a gate and a drain of which are coupled together;
   and wherein said gates of said first and second MOSFETs are coupled together.

3. A semiconductor integrated circuit as claimed in claim 1, wherein said third switching element includes a fifth MOSFET a gate and a source or drain of which are coupled together.

4. A semiconductor integrated circuit as claimed in claim 1, wherein the turning-on state of each of said first, second, and third switching elements is realized by using at least one depletion-type MOSFET.

* * * * *